United States Patent
Farys

(10) Patent No.: US 9,105,699 B2
(45) Date of Patent: Aug. 11, 2015

(54) METHOD OF FORMING INTERCONNECTION LINES

(71) Applicant: STMicroelectronics (Crolles 2) SAS, Crolles (FR)

(72) Inventor: Vincent Farys, Saint Martin d' 'Heres (FR)

(73) Assignee: STMICROELECTRONICS (CROLLES 2) SAS, Crolles (FR)

(*) Notice: Subject to any disclaimer, the term of this patent is extended or adjusted under 35 U.S.C. 154(b) by 0 days.

(21) Appl. No.: 14/167,065

(22) Filed: Jan. 29, 2014

(65) Prior Publication Data

US 2014/0210105 A1 Jul. 31, 2014

(30) Foreign Application Priority Data

Jan. 31, 2013 (FR) ...................................... 13 50814

(51) Int. Cl.
*H01L 21/768* (2006.01)
*H01L 23/528* (2006.01)
*H01L 21/033* (2006.01)
*H01L 21/3213* (2006.01)

(52) U.S. Cl.
CPC ...... *H01L 21/76895* (2013.01); *H01L 21/0337* (2013.01); *H01L 21/0338* (2013.01); *H01L 21/32139* (2013.01); *H01L 21/76838* (2013.01); *H01L 23/528* (2013.01)

(58) Field of Classification Search
CPC combination set(s) only.
See application file for complete search history.

(56) References Cited

U.S. PATENT DOCUMENTS

| | | | |
|---|---|---|---|
| 8,309,462 B1 | 11/2012 | Yoshida et al. | |
| 2007/0212892 A1* | 9/2007 | Caspary et al. | 438/736 |
| 2009/0093121 A1* | 4/2009 | Moon | 438/696 |
| 2012/0193792 A1* | 8/2012 | Kim et al. | 257/741 |
| 2012/0241975 A1* | 9/2012 | Farys et al. | 257/774 |
| 2013/0012023 A1* | 1/2013 | Park et al. | 438/689 |
| 2013/0277823 A1* | 10/2013 | Ogisu et al. | 257/734 |

* cited by examiner

*Primary Examiner* — Khaja Ahmad
(74) *Attorney, Agent, or Firm* — Allen, Dyer, Doppelt, Milbrath & Gilchrist, P.A.

(57) ABSTRACT

The invention concerns a method comprising: forming a plurality of parallel lines (502, 504, 506) of a sacrificial material over a layer of conductive material (510) of an integrated circuit, said parallel lines being separated by trenches, at least one of said lines being interrupted along its length by an opening (516) dividing it into first and second line portions (504A, 504B) separated by a space (S); forming spacers (522, 524, 526, 528, 530) in said trenches on lateral sides of said line portions and filling at least a bottom part of said opening between the line portions; removing the sacrificial material by etching; and forming interconnection lines (302, 304A, 304B, 306A, 306B, 308, 310) of said conductive material based on a pattern defined by said spacers.

8 Claims, 4 Drawing Sheets

METHOD OF FORMING INTERCONNECTION LINES

CROSS REFERENCE TO RELATED APPLICATION

This application is a translation of and claims the priority benefit of French patent application number 13/50814 filed on Jan. 31, 2013, entitled "METHOD OF FORMING INTERCONNECTION LINES," which is hereby incorporated by reference to the maximum extent allowable by law.

FIELD

The present disclosure relates to a method of forming interconnection lines on an integrated circuit, and to an integrated circuit comprising interconnection lines.

BACKGROUND

The interconnection layers of an integrated circuit permit electrical connections to be made to various underlying silicon devices, such as transistors or other components. In order to provide a solution that is relatively economic in terms of surface area and cost, an interconnection layer is generally based on a series of parallel interconnection lines formed across the integrated circuit. These parallel lines are modified to suit a given application by features such as connections between the lines and cuts in the lines.

For interconnection technologies where a pitch between the lines of 90 nm or less is to be achieved, it has been proposed to use unidirectional masks, meaning that each mask comprises lines or line portions running in one direction only. This means that there is an added constraint that it is no longer possible to form, at the same time as the parallel interconnection lines, connections running perpendicular to these lines. This constraint adds complexity and cost to the process of forming interconnections.

Therefore, there is a general need for an improved method of forming, on an integrated circuit, interconnection lines having a low pitch.

SUMMARY

It is an aim of embodiments of the present disclosure to at least partially address one or more needs in the prior art.

According to one aspect, there is provided a method comprising forming a plurality of parallel lines of a sacrificial material over a layer of conductive material of an integrated circuit, the parallel lines being separated by trenches, at least one of the lines being interrupted along its length by an opening dividing it into first and second line portions separated by a space; forming spacers in the trenches on lateral sides of the line portions and filling at least a bottom part of the opening between the line portions; removing the sacrificial material by etching; and forming interconnection lines of the conductive material based on a pattern defined by the spacers.

According to an embodiment, the spacers have a width in the range 18 to 45 nm, and the space between the first and second line portions is between 1.25 and 1.75 times the width of the spacers.

According to an embodiment, the trenches separating the parallel lines have a width in the range 54 to 135 nm.

According to an embodiment, forming the plurality of parallel lines of sacrificial material comprises making a cut to form the opening in the at least one line.

According to an embodiment, the spacer filling the opening defines, during the formation of the interconnection lines, a connection between first and second adjacent parallel interconnection lines, the method further comprising: making a first cut interrupting the first interconnection line along its length to form first and second interconnection line portions; and making a second cut interrupting the second interconnection line along its length to form third and fourth interconnection line portions, wherein the first and fourth interconnection line portions are electrically connected by the connection.

According to an embodiment, a distance between the centers of the first and second cuts is less than 80 nm, and the first and second cuts are formed by first and second photolithography operations.

According to an embodiment, a distance between the centers of the first and second cuts is equal to at least 80 nm, and the first and second cuts are formed by a single photolithography operation.

According to an embodiment, the conductive material is polysilicon.

According to an embodiment, the plurality of parallel lines of sacrificial material are formed on a hard mask layer formed over the layer of conductive material, wherein forming the interconnection lines comprises performing etching to remove the hard mask layer where it is not protected by the spacers.

According to an embodiment, forming the spacers comprises: depositing a layer of silicon oxide; and partially etching the layer of silicon oxide partially exposing the bottom of the trenches.

According to another aspect, there is provided an integrated circuit comprising: a plurality of parallel interconnection lines; and a connection electrically connecting first and second adjacent lines of the parallel interconnection lines together, wherein a distance separating the adjacent pair of interconnection lines is between 26 and 45 nm, and wherein the adjacent pair of interconnection lines and the connection are in a same layer of the integrated circuit.

According to an embodiment, the first interconnection line is interrupted along its length by a first cut dividing it into first and second interconnection line portions; and the second interconnection line is interrupted along its length by a second cut dividing it into third and fourth interconnection line portions, wherein the first and fourth line portions are electrically connected by the connection.

BRIEF DESCRIPTION OF THE DRAWINGS

The foregoing and other features and benefits will become apparent from the following detailed description of embodiments, given by way of illustration and not limitation with reference to the accompanying drawings, in which.

As is normal in the case of drawings of semiconductor structures, the various figures are not drawn to scale.

DETAILED DESCRIPTION OF EMBODIMENTS OF THE PRESENT DISCLOSURE

Figure 1:
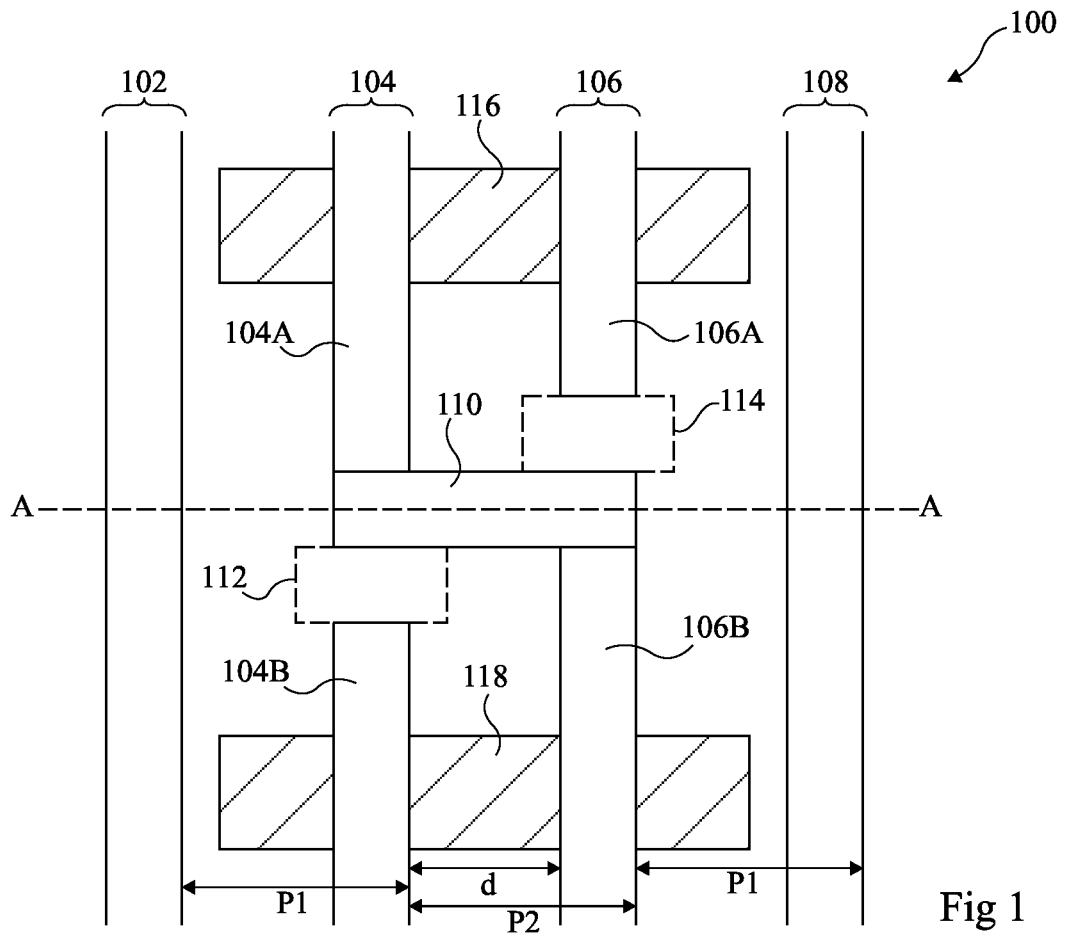
FIG. 1 illustrates, in plan view, a portion of an integrated circuit comprising parallel interconnection lines.

FIG. 1 illustrates, in plan view, a portion 100 of an integrated circuit comprising interconnection lines formed according to a method that has been proposed.

Four parallel interconnection lines 102, 104, 106 and 108 are illustrated, formed for example of polysilicon. A connection 110 perpendicular to the lines electrically connects the lines 104 and 106. Line 104 is interrupted along its length by a cut 112 shown as a dashed rectangle in FIG. 1, representing an opening in a hard mask used to form this cut. Thus the line 104 is divided into two line portions 104A and 104B. Line 106 is also interrupted along its length by a cut 114 shown as a dashed rectangle in FIG. 1 representing an opening in a hard mask used to form this cut. Thus the line 106 is divided into two line portions 106A and 106B. The connection 110 for example connects the line portion 104A to the line portion 106B.

In one example, active regions 116 and 118 are present in an underlying semiconductor layer, region 116 for example being under the line portions 104A and 106A, and region 118 for example being under the lines portions 104B and 106B. One or more contacts (not shown in FIG. 1) are for example formed between the line portion 104A and/or 106A and the underlying active region 116, and/or between the line portion 104B and/or 106B and the underlying active region 118.

The pitch of the lines 102 to 108 in FIG. 1 is for example as low as 64 nm in the final device. The pitch is defined as the distance from an edge of one line to the same edge of an adjacent line, as represented by the pitches P1 and P2 in FIG. 1. Alternatively, the pitch can be defined as the distance from the center of one line to the center of an adjacent line. This for example corresponds to a distance d of around 50 nm separating one line from the next. To achieve such a low pitch, the process for forming the lines 102 to 108 involves forming odd and even lines using separate masks. For example lines 102 and 106 are formed in a first photolithography step using a first mask, and lines 104 and 108 are formed in a subsequent photolithography step using another mask. Any misalignment between these masks would lead to variations in the pitch between alternate lines, for example leading to a difference between the pitches P1 and P2 in FIG. 1. Pitch P1 is the pitch corresponding to the interval between lines 102 and 104, and between lines 106 and 108. Pitch P2 is the pitch corresponding to the interval between lines 104 and 106.

The connection 110 is formed during a separate photolithography step using a further photolithography mask, and if further similar connections are to be formed relatively close to each other, two photolithography steps may be needed to form all of these connections.

Due to their proximity to each other, the cuts 112 and 114 are for example formed during two further photolithography steps, each using a further photolithography mask.

Thus such a method of forming the interconnections of FIG. 1 for example involves the use of at least four to six masks.

Figure 2:
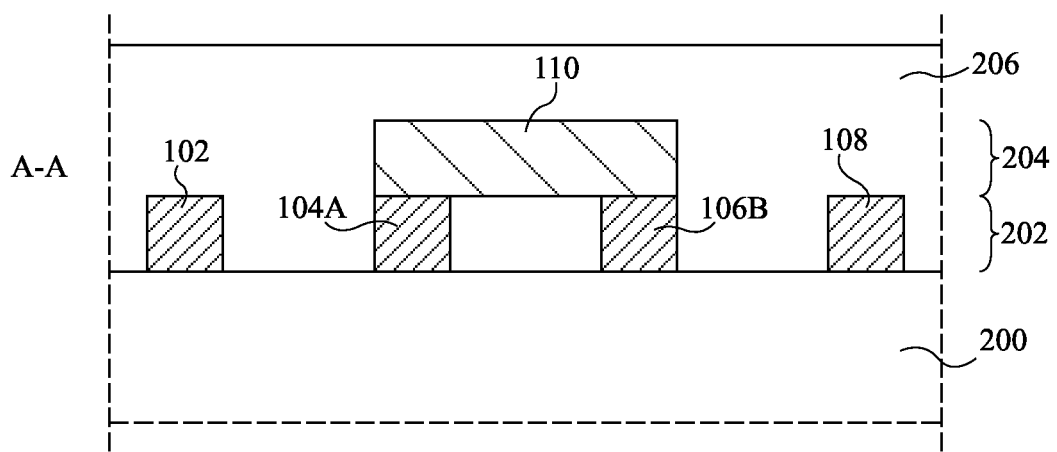
FIG. 2 is a cross-section view of the parallel interconnection lines of the integrated circuit of FIG. 1.

FIG. 2 is a cross-section view taken along a dashed line A-A in FIG. 1, which passes perpendicular to the interconnection lines 102 to 108, and passes through the connection 110.

As illustrated in FIG. 2, the device comprises a semiconductor device layer 200, over which the polysilicon interconnection lines 102 to 108 are formed. These lines 102 to 108 are formed in a layer 202 at a corresponding level of the integrated circuit. The connection 110 connecting the line portions 104A and 106B is formed in another layer 204, at another level in the integrated circuit. In particular, this connection 110 is introduced after the formation of the lines. Therefore, to make contact with the line portions 104A and 106B, a top surface of these line portions is exposed and a material forming the connection is deposited. The lines 102 to 108 and the connection 110 are for example covered by a layer 206 of insulating material.

Figure 3:
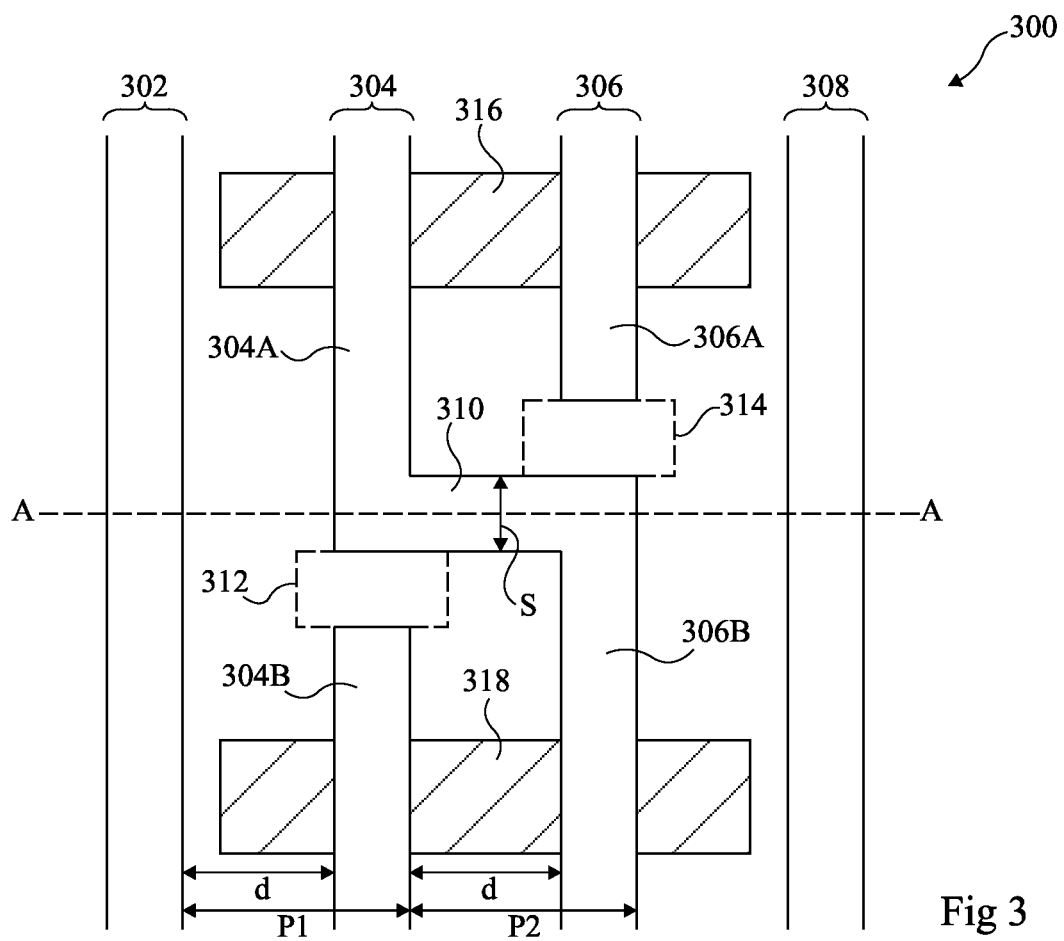
FIG. 3 illustrates, in plan view, a portion of an integrated circuit comprising parallel interconnection lines according to an example embodiment of the present disclosure.

FIG. 3 illustrates in plan view a portion 300 of an integrated circuit comprising interconnection lines according to an example embodiment of the present disclosure.

Four parallel interconnection lines 302, 304, 306 and 308 are illustrated. The interconnection lines 304 and 306 are electrically connected by a connection 310, which is for example substantially perpendicular to the lines 304 and 306. As with the embodiment of FIG. 1, the line 304 is interrupted along its length by a cut 312, dividing line 304 into separate line portions 304A and 304B. Similarly, line 306 is interrupted along its length by a cut 314, dividing line 306 into separate line portions 306A and 306B. The connection 310 electrically connects, in this example, the line portions 304A and 306B.

The pitches P1 between the lines 302 and 304 and P2 between the lines 304 and 306 are for example the same as each other due to an auto-alignment of the lines, as will be described in more detail below. This pitch is for example between 36 and 90 nm. This for example corresponds to a distance d of between 26 and 45 nm separating adjacent parallel interconnection lines.

As with the example of FIG. 1, active regions, labeled 316 and 318 in FIG. 3 are present in an underlying semiconductor layer, region 316 for example being under the line portions 304A and 306A, and region 318 for example being under the lines portions 304B and 306B. While not illustrated in FIG. 3, one or more contacts are for example present between the line portion 304A and/or 306A and the underlying active region 316 and/or between the line portion 304B and/or 306B and the underlying active region 318.

Figure 4:
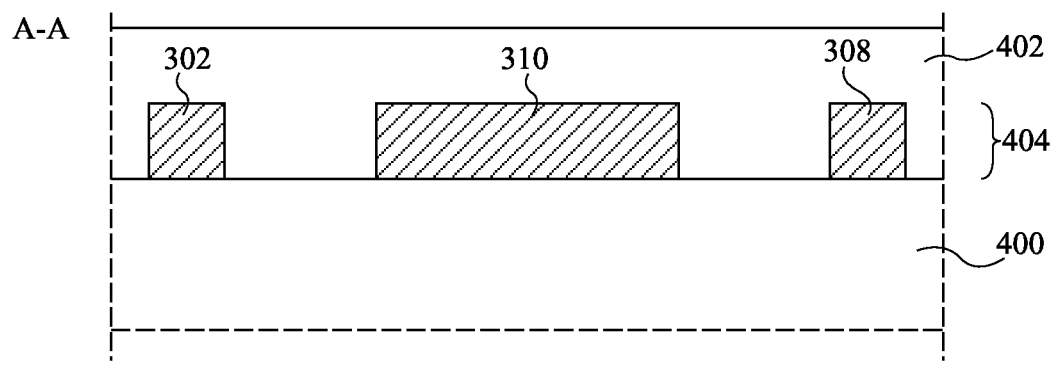
FIG. 4 is a cross-section view of the parallel interconnection lines of the integrated circuit of FIG. 3 according to an example embodiment of the present disclosure.

FIG. 4 illustrates a cross-section of the integrated circuit portion 300 taken along a dashed line A-A in FIG. 3, passing perpendicular to the parallel lines 302 and 308, and passing through the connection 310.

As illustrated in FIG. 4, the interconnection lines 302 to 308 are formed over a semiconductor device layer 400, which may comprise active regions formed in a semiconductor substrate, and one or more further layers formed over it, which for example include devices such as transistor gates.

The connection 310 is formed over the semiconductor device layer 400 in the same layer of the integrated circuit as the interconnection lines 302 to 308. For example, as will become clear below, the connection is formed from a same layer of conductive material as the lines 302 to 308. These interconnection lines 302 to 308 and the connection 310 are for example formed at a same level in the integrated circuit, and directly on the semiconductor device layer 400, although in alternative embodiments they could all be separated from the semiconductor device layer 400 by one or more further layers. The interconnection lines 302 to 310 are for example encapsulated in a layer of insulating material 402.

FIGS. 5A to 5F illustrate, in plan view, a portion 500 of an integrated circuit during a process for forming interconnection lines according to an example embodiment of the present disclosure. As used in the following, when a layer or feature is described as being formed or positioned "over" another underlying layer or feature, this covers both the case in which it is formed directly over the underlying layer or feature and the case in which it is separated from the underlying layer or feature by one or more intermediate layers.

Figure 5A:
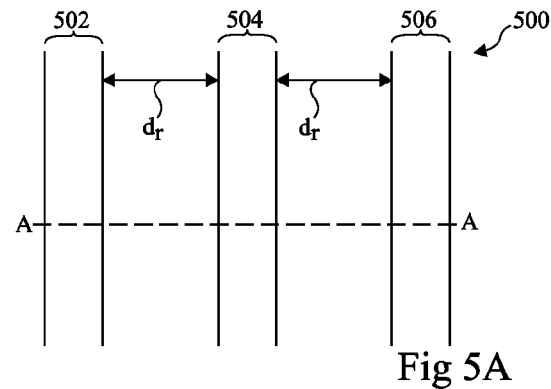
FIGS. 5A to 5F illustrate, in plan view, a portion of an integrated circuit during steps in a method of forming interconnection lines according to an example embodiment of the present disclosure.

With reference to FIG. 5A, initially, during a photolithography operation, a photoresist is for example patterned with parallel lines 502, 504 and 506. These lines are for example separated from each other by a distance $d_r$, which is for example in the range 54 to 135 nm. The width of each line 502 to 506 is for example in the range 18 to 45 nm, and as it will become apparent from the following description, this width determines the distance separating the parallel interconnection lines that will be formed.

Figure 6A:
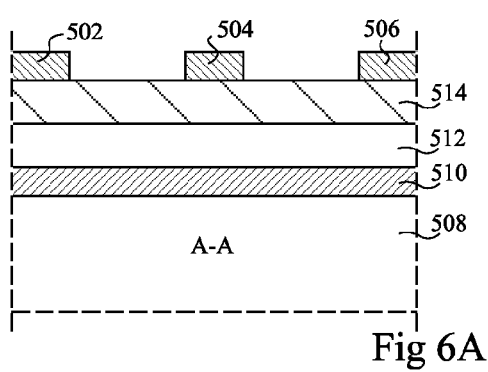
FIGS. 6A to 6G are cross-section views of the integrated circuit of FIGS. 5A to 5F according to an example embodiment of the present disclosure.

FIG. 6A is a cross-section view taken along a line A-A shown in FIG. 5A, which passes across the integrated circuit portion 500 perpendicular to the lines 502, 504 and 506. The structure for example comprises a semiconductor layer 508, which could correspond to a semiconductor substrate or to an SOI (silicon on insulator) layer. A conductive layer 510, for example of polysilicon, is formed over the silicon layer 508. Layer 510 for example has a thickness of between 30 and 100 nm. A hard mask 512 is for example formed over the conductive layer 510. The hard mask 512 is formed of a sacrificial material, such as for example titanium nitride, although other materials such as silicon carbide could be used. A further hard mask layer 514 formed of a further sacrificial material, which is for example capable of being selectivity etched with respect to the hard mask 512, is formed over the hard mask 512. For example, the further hard mask layer 514 is formed of SOC (spin on carbon). The lines 502, 504 and 506 of the photoresist are formed over layer 514.

Figure 5B:
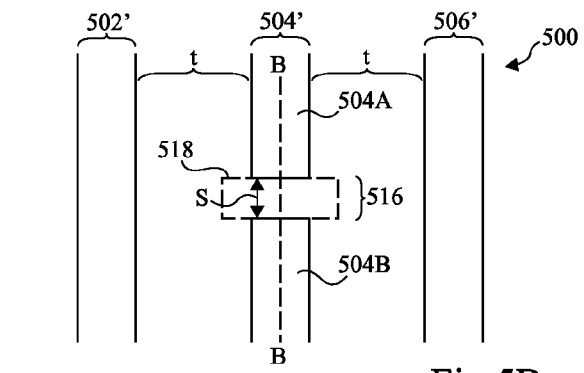

FIG. 5B illustrates the integrated circuit portion 500 after a subsequent step, in which etching is performed to pattern the further hard mask 514 based on the pattern defined by the photoresist. This results in lines 502', 504' and 506', which correspond respectively to the lines 502, 504 and 506 of the photoresist, but are formed in the further hard mask layer 514. The lines 502', 504' and 506' are separated by trenches t.

As also illustrated in FIG. 5B, a cut 516 is for example formed in the line 504', in a direction perpendicular to the lines 502' to 506'. The cut 516 interrupts the line 504' along its length, dividing the line 504' into line portions 504A and 504B separated by a space S. The space S is for example between 1.25 and 1.75 times the width of interconnection lines to be formed. As will become apparent herein after, the space S is for example chosen such that a spacer fills the gap between the line portions. For example, an experiment has shown that a space of 40 nm is filled by a spacer having a width of 32 nm, and in such a case the space S is 1.25 times the width of the spacer. In one example, the space S is between 40 and 56 nm wide. As represented by a dashed rectangle 518, the cut 516 is for example implemented by a photolithography operation in which a hard mask is formed having an opening corresponding to the rectangle 518. Of course, one or more further cuts could be made during the same photolithography operation at different locations along line 504', and/or along the lines 502' or 506', or other lines not shown in FIG. 5B.

Figure 6B:
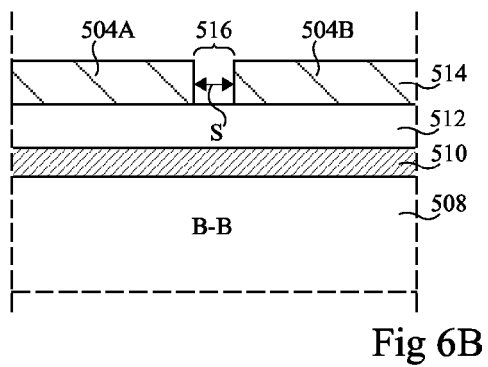

FIG. 6B is a cross-section view corresponding to a dashed line B-B shown in FIG. 5B crossing the integrated circuit portion 500 in the direction of the lines 502' to 506', and passing through the centre of line 504'. FIG. 6B illustrates the line portions 504A and 504B with the opening created by the cut 516, having a width S.

Figure 5C:
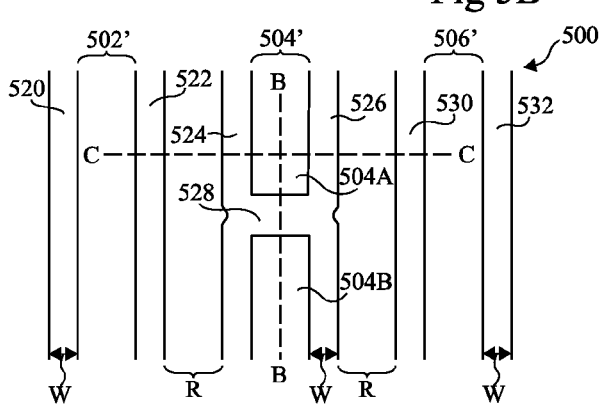

FIG. 5C illustrates the integrated circuit portion 500 after a subsequent step, in which spacers are formed on the lateral sides of the lines 502', 504' and 506' in the trenches separating the lines, and within the opening formed by cut 516. In particular, spacers 520 and 522 are respectively formed on the left-hand and right-hand sides of the line 502' in FIG. 5C, spacers 524 and 526 are respectively formed on the left-hand and right-hand sides of line 504' in FIG. 5C, a spacer 528 is formed in the opening between the line portions 504A and 504B, thereby linking the spacers 524 and 526, and spacers 530 and 532 are respectively formed on the left-hand and right-hand sides of line 506' in FIG. 5C.

As is well known in the field of MOS transistor technology, spacers are generally silicon oxide layers formed vertically on each side of a gate stack, and generally serve a purpose of separating the source and drains from the gate stack of the MOS transistor. The spacers of FIG. 5C are for example formed using a same technique as one used in transistor technology, but rather that being formed on either side of gate stack, the spacers are formed on either side of the lines 502' to 506' formed from the hard mask layer 514. The spacers are for example formed by depositing a layer of silicon oxide over the device, and then etching for a determined duration, such that a silicon oxide layer remains at the lateral sides of each of the lines 502' to 506', where the etch rate is greatly reduced. The bottom of each of the trenches t is for example partially exposed in a central region labeled R. For example, by varying the time of the etching step, the widths of the spacers may be controlled to a relatively high precision. For example, the spacers are formed having a width w of between 18 and 45 nm. In some embodiments, the spacers could be formed of materials other than silicon oxide.

Figure 6C:
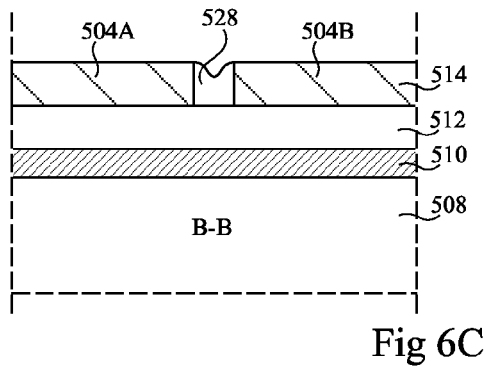

FIG. 6C is a cross-section view corresponding to a dashed line B-B in FIG. 5C crossing the integrated circuit in the direction of the lines 502' to 506', and passing through the centre of the line 504'. As illustrated, the spacer 528 for example substantially fills the opening between the line portions 504A and 504B, and for example fills at least a bottom part of the opening.

Figure 6D:
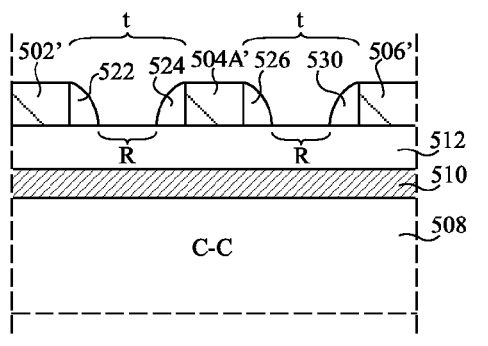

FIG. 6D is a cross-section view corresponding to a dashed line C-C of FIG. 5C crossing the integrated circuit portion 500 in a direction perpendicular to the lines 502', 504' and 506', and crossing the line portion 504A. This cross-section illustrates the spacers 522, 524, 526 and 530 formed in the trenches t on the lateral sides of the lines 502', 504A and 506'.

Figure 5D:
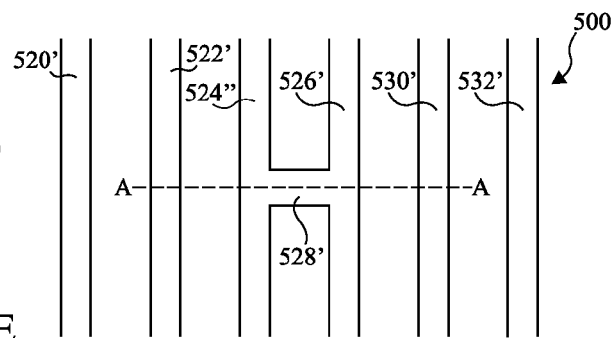

FIG. 5D illustrates the integrated circuit portion 500 after a subsequent step in which etching is performed to remove the sacrificial material of lines 502', 504' and 506'. Another etching is then for example used to remove portions of the hard mask 512 based on the pattern defined by the spacers. Thus, the hard mask layer 512 is patterned such that it comprises parallel lines 520', 522', 524', 526', 530' and 532' corresponding to spacers 520, 522, 524, 526, 530 and 532 respectively, and a line 528' corresponding to spacer 528 running perpendicular to the lines 520' to 532', and connecting the lines 524' and 526'.

Figure 6E:
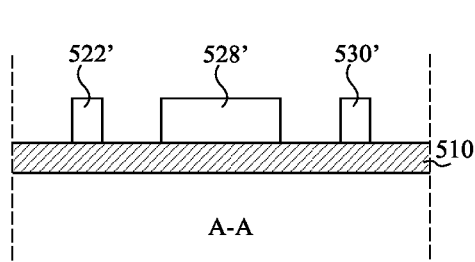

FIG. 6E is a cross-section view corresponding to a dashed line A-A shown in FIG. 5D crossing the integrated circuit portion 500 in a direction perpendicular to the lines 520' to 532', and passing through the connection 528'.

Figure 5E:
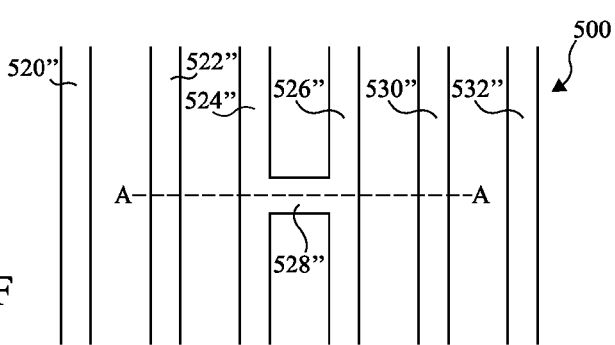

FIG. 5E illustrates the integrated circuit portion 500 following a further step in which a further etch is performed to apply the pattern of the hard mask 512 to the underlying conductive layer 510, to create corresponding interconnection lines 520", 522", 524", 526", 530" and 532", and a connection 528" electrically connecting the lines 524" and 526".

Figure 6F:
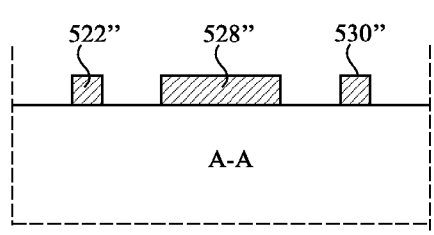

FIG. 6F is a cross-section view corresponding to a dashed line A-A shown in FIG. 5E crossing the integrated circuit portion 500 in a direction perpendicular to the lines 520" to 532", and passing through the connection 528".

Thus the resulting structure comprises adjacent interconnection lines 524" and 526" electrically connected by a connection 528" formed in the same layer. Advantageously, due to the process of using spacers to form the lines, the lines can have a low pitch of around half the pitch that would be possible using a standard technique based on a single photolithograpy mask. Furthermore, whereas there is a risk of misalignment between masks in the technique described with reference to FIGS. 1 and 2, in the method described in relation to FIGS. 5A to 5E, a single mask is used to form the lines 502 to 506, and thus the resulting interconnection lines are all auto-aligned with each other.

In some embodiments, a further operation is then performed to cut the line 524" and/or 526", as will now be described with reference to FIGS. 5F and 6G.

Figure 5F:
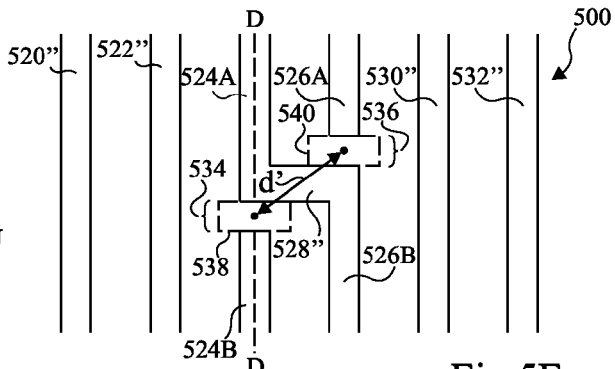

FIG. 5F illustrates the integrated circuit portion 500 after a subsequent step in which cuts 534 and 536 are made in the lines 524" and 526" respectively. The cut 534 interrupts the line 524" along its length, dividing line 524" into line portions 524A and 524B. Similarly, cut 536 interrupts the line 526" along its length, dividing line 526" into line portions 526A and 526B. The centres of the cuts 534 and 536 are separated by a distance d', and they are positioned on different sides of the connection 528". The connection 528" connects the line portion 524A to the line portion 526B.

Dashed rectangles 538 and 540 represent openings in one or two masks used to make the cuts 534 and 536. Depending on the distance d' between centre of the cuts 534, 536, the cuts are for example formed using a same photolithograph mask or separate photolithography masks. For example, if the distance d' is less than 80 nm, separate photolithography masks are for example used to implement these cuts 534 and 536, and the area taken up by the cuts 534 and 536 and the connection 528" will be relatively small. Alternatively, if the distance d' is equal to or more than 80 nm, the cuts 534 and 536 are for example implemented using a single mask.

Figure 6G:
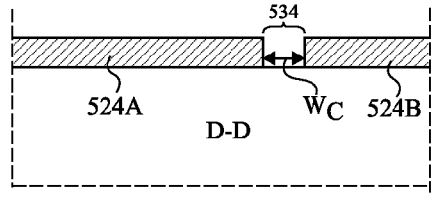

FIG. 6G is a cross-section view corresponding to a dashed line D-D in FIG. 5F crossing the integrated circuit portion 500 in the direction of lines 520" to 532", and passing along line 524". As illustrated, cut 534 for example has a width $w_C$, which is for example in the range 20 to 40 nm.

Figure 7:
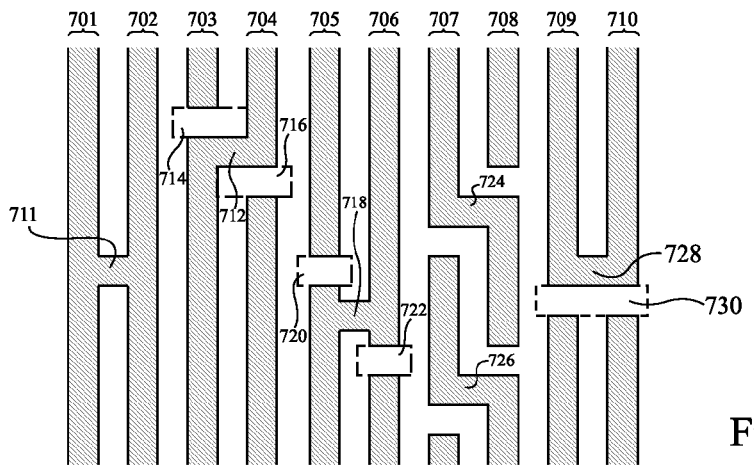
FIG. 7 illustrates, in plan view, interconnection lines according to an example embodiment of the present disclosure.

FIG. 7 illustrates a layout of parallel interconnection lines 701 to 710 running vertically in the figure, according to an example embodiment in which the lines are formed based on the techniques described above.

Of these lines, the lines 701 and 702 are for example electrically connected by a connection 711 using the techniques described herein, without any cuts being formed, such that the interconnecting lines form the shape of a letter "H".

The lines 703 and 704 are for example electrically connected by a connection 712 using the techniques described herein. A cut 714 is for example applied to line 703 on one side of the connection 712, and a cut 716 is applied to line 704 on the other side of connection 712. The distance separating the cuts 714, 716 in this example is for example substantially equal to the thickness of a line, for example between 20 and 40 nm, and the cuts are for example formed using separate photolithography masks. The cuts for example overlap the connection 712, thereby reducing its width.

The lines 705 and 706 are also for example electrically connected using the techniques described herein by a connection 718. A cut 720 is for example applied to line 705 on one side of the connection 718, and a cut 722 is applied to line 706 on the other side of connection 718. The distance between the centres of the cuts 720, 722 is over 80 nm, for example around 90 nm, which is larger that the width of the connection 718, which is for example approximately 50 nm in this example. In this example, the cuts 720, 722 are formed using a single photolithography mask. Of course, in practice, the cut separation between cuts 720 and 722, which permits a single mask to be used, would not generally be used in the same circuit as the cut separation between cuts 714 and 716, which uses two separate masks.

The lines 707 and 708 are for example electrically connected by two connections 724, 726, and in this example two cuts are made in each of the lines 707 and 708 such that each line is divided into three line portions, referred to hereafter from top to bottom in FIG. 7 as upper, middle and lower line portions. The middle line portion of line 707 is connected by connection 726 to the lower line portion of line 708, and the middle line portion of line 708 is connected by connection 724 to the upper line portion of line 707.

The lines 709 and 710 are for example electrically connected by a connection 728 joining the upper portions of lines 709 and 710 in the shape of a letter "U", and a cut 730 is made across the two lines 709, 710 adjacent to the connection 728.

Thus, a method has been described for forming auto-aligned interconnecting lines and a connection between adjacent interconnecting lines, using relatively few photolithography operations. In particular, the process of FIGS. 5A to 5E of forming the interconnection lines and one or more connections between the lines used only three or four photolithography masks, as compared to four to six used in the technique of FIGS. 1 and 2.

Advantageously, the connection between adjacent lines is implemented by a simple cut involving a single photolithography mask, resulting in a connection formed in a same layer of the integrated circuit as the lines.

While a number of embodiments of the present disclosure have been described, it will be apparent to those skilled in the art that there are numerous further modifications and variations that could be applied.

For example, it will be apparent to those skilled in the art that the process described herein could be applied to interconnection lines formed of polysilicon, or of another conductive material, such as Aluminium, TiN or Tungsten. Furthermore, it will be apparent to those skilled in the art that the process described herein can be extended to forming multiple connections between adjacent lines and multiple cuts in the lines, using the same photolithography steps described above.

The invention claimed is:

1. A method comprising:
    forming a plurality of parallel lines in an upper mask layer, the upper mask layer being over and in contact with a lower mask layer, and the lower mask layer being over a layer of conductive material of an integrated circuit, said plurality of parallel lines being separated by trenches;
    forming an opening dividing at least one of the plurality of parallel lines into first and second line portions separated by a space;
    forming spacers in said trenches on lateral sides of said first and second line portions and substantially filling at least a bottom part of said opening between the first and second line portions;

removing the plurality of parallel lines along with corresponding portions of the lower mask layer below the plurality of parallel lines;

removing the spacers to define a corresponding pattern in the lower mask layer, wherein the corresponding pattern in the lower mask includes a connection corresponding to the opening dividing the at least one of the plurality of parallel lines, and the connection extending perpendicularly between two adjacent lines of the corresponding pattern in the lower mask; and forming interconnection lines of said conductive material based on the pattern defined in the lower mask layer.

2. The method of claim 1, wherein said spacers have a width in a range 18 nm to 45 nm, and wherein said space between the first and second line portions is between 1.25 and 1.75 times the width of said spacers.

3. The method of claim 1, wherein said trenches separating said plurality of parallel lines have a width in a range 54 nm to 135 nm.

4. The method of claim 1, wherein the spacers filling said opening define, during the formation of the interconnection lines, a connection between first and second adjacent parallel interconnection lines, the method further comprising:

making a first cut interrupting a first interconnection line along its length to form first and second interconnection line portions; and making a second cut interrupting a second interconnection line along its length to form third and fourth interconnection line portions, wherein said first and fourth interconnection line portions are electrically connected by said connection between the first and second adjacent parallel interconnection lines.

5. The method of claim 4, wherein a distance between centers of said first and second cuts is less than 80 nm.

6. The method of claim 4, wherein a distance between centers of said first and second cuts is equal to at least 80 nm.

7. The method of claim 1, wherein said conductive material comprises polysilicon.

8. The method of claim 1, wherein forming said spacers comprises:

depositing a layer of silicon oxide; and partially etching the layer of silicon oxide to expose at least a portion of the bottom of said trenches.

\* \* \* \* \*